(12) United States Patent
Zheng et al.

(10) Patent No.: US 12,155,177 B2
(45) Date of Patent: Nov. 26, 2024

(54) EXTERNAL RESONATOR-TYPE SEMICONDUCTOR LASER DEVICE

(71) Applicant: HAMAMATSU PHOTONICS K.K., Hamamatsu (JP)

(72) Inventors: Yujin Zheng, Hamamatsu (JP); Takashi Sekine, Hamamatsu (JP); Yoshinori Kato, Hamamatsu (JP); Norio Kurita, Hamamatsu (JP); Toshiyuki Kawashima, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 917 days.

(21) Appl. No.: 17/265,983

(22) PCT Filed: May 31, 2019

(86) PCT No.: PCT/JP2019/021831
§ 371 (c)(1),
(2) Date: Feb. 4, 2021

(87) PCT Pub. No.: WO2020/031475
PCT Pub. Date: Feb. 13, 2020

(65) Prior Publication Data
US 2021/0313769 A1  Oct. 7, 2021

(30) Foreign Application Priority Data
Aug. 8, 2018 (JP) .................... 2018-149327

(51) Int. Cl.
*H01S 5/00* (2006.01)
*H01S 3/08* (2023.01)
(Continued)

(52) U.S. Cl.
CPC .......... *H01S 5/147* (2013.01); *H01S 3/08013* (2013.01); *H01S 3/1055* (2013.01);
(Continued)

(58) Field of Classification Search
CPC .... H01S 5/147; H01S 3/08013; H01S 3/1055; H01S 5/0239; H01S 5/141; H01S 5/4012; H01S 5/0654
See application file for complete search history.

(56) References Cited

U.S. PATENT DOCUMENTS 7,212,554 B2   5/2007  Zucker et al.
2005/0018743 A1  1/2005  Volodin et al.
(Continued)

FOREIGN PATENT DOCUMENTS

CN  101859974 A  10/2010
CN  103762489 A   4/2014
(Continued)

OTHER PUBLICATIONS

Yufeng Li et al., "Wavelength locking of high-power diode laser bars by volume Bragg gratings", Photonics Society Summer Topical Meeting Series, 2012 IEEE, IEEE, Jul. 9, 2012, p. 29-p. 30, XP032224875.
(Continued)

*Primary Examiner* — Kinam Park
(74) *Attorney, Agent, or Firm* — Faegre Drinker Biddle & Reath LLP (57) ABSTRACT

An external resonator-type semiconductor laser device 1A includes an external resonator formed of one or a plurality of laser diode light sources and a VBG; an optical fiber which outputs output light La from the laser diode light source toward the VBG, and into which return light Lb from the VBG is input; and a displacement unit that displaces a
(Continued)

disposition position of the VBG with respect to an input and output end surface of the optical fiber.

4 Claims, 5 Drawing Sheets

(51) Int. Cl.
*H01S 3/1055* (2006.01)
*H01S 5/0239* (2021.01)
*H01S 5/14* (2006.01)
*H01S 5/40* (2006.01)
*H01S 5/065* (2006.01)

(52) U.S. Cl.
CPC ............ *H01S 5/0239* (2021.01); *H01S 5/141* (2013.01); *H01S 5/4012* (2013.01); *H01S 5/0654* (2013.01)

(56) References Cited

U.S. PATENT DOCUMENTS

| | | | | |
|---|---|---|---|---|
| 2005/0265416 | A1* | 12/2005 | Zucker | H01S 5/4062 372/50.12 |
| 2006/0256827 | A1* | 11/2006 | Volodin | H01S 5/141 372/50.23 |
| 2015/0124848 | A1* | 5/2015 | Ovtchinnikov | H01S 5/0064 372/50.1 |
| 2015/0131690 | A1* | 5/2015 | Connolly | H01S 5/12 372/50.11 |
| 2017/0033537 | A1* | 2/2017 | Zheng | H01S 3/08081 |
| 2017/0199389 | A1* | 7/2017 | Liu | H01S 5/0078 |

FOREIGN PATENT DOCUMENTS

| | | |
|---|---|---|
| JP | 2003-318480 A | 11/2003 |
| JP | 2007-527616 A | 9/2007 |
| JP | 2008-060120 A | 3/2008 |
| JP | 2014-063933 A | 4/2014 |
| WO | WO-2005/013439 A2 | 2/2005 |

OTHER PUBLICATIONS

International Preliminary Report on Patentability mailed Feb. 18, 2021 for PCT/JP2019/021831.

Zhaoxin, Zhu et al., "High-power and wavelength-tunable operation of an Er/Yb co-doped fiber laser based on volume Bragg grating," Journal of Jiangsu Normal University (Natural Science Edition), vol. 30, No. 3, Sep. 2012.

* cited by examiner

EXTERNAL RESONATOR-TYPE SEMICONDUCTOR LASER DEVICE

TECHNICAL FIELD

The present disclosure relates to an external resonator-type semiconductor laser device.

BACKGROUND ART

In general, a semiconductor laser device has excellent features such as high efficiency, small size, light weight, and long life. For this reason, the semiconductor laser device is applied in a very wide range of fields such as material processing, solid-state laser excitation, environmental measurement, spectroscopic analysis, and medicine. Meanwhile, laser light output from the semiconductor laser device has a large radiation angle and a wide spectral band. For this reason, for example, the field such as solid-state laser excitation requires a technique of stably narrowing the oscillation spectrum of the laser light.

Examples of the technique of stably narrowing the oscillation spectrum of the laser light include an external resonator-type semiconductor laser device. For example, Patent Literature 1 discloses a laser device in which an external resonator is formed of a plurality of LD light sources and a VBG for the purpose of a high output and stabilization of laser light. For example, Patent Literature 2 discloses a light emitting device that causes light to be incident on a volume bragg grating (VBG), the light being condensed by a lens, to adjust the output characteristics of a laser light source.

CITATION LIST

Patent Literature

Patent Literature 1: U.S. Pat. No. 7,212,554
Patent Literature 2: Japanese Unexamined Patent Publication No. 2007-527616

SUMMARY OF INVENTION

Technical Problem

For further applications of the semiconductor laser device, in addition to stably narrowing the band of the laser light, it is also an important factor to adjust the output of the laser light. However, in the above-described laser devices disclosed in Patent Literatures 1 and 2, in order to adjust the output of the laser light, the VBG forming the external resonator is required to be replaced with a VBG having a different reflectance, so that it is difficult to obtain the ease of adjustment of the output, which is a problem.

The present disclosure has been made to solve the above problem, and an object of the present disclosure is to provide an external resonator-type semiconductor laser device capable of stably narrowing the band of laser light and easily performing output adjustment.

Solution to Problem

According to one aspect of the present disclosure, there is provided an external resonator-type semiconductor laser device including: an external resonator formed of one or a plurality of laser diode light sources and a VBG; an optical fiber which outputs output light from the laser diode light source toward the VBG, and into which return light from the VBG is input; and a displacement unit that displaces a disposition position of the VBG with respect to an input and output end surface of the output light and the return light in the optical fiber.

In the external resonator-type semiconductor laser device, the external resonator is formed of the VBG, so that the wavelength of light resonating in the external resonator can be selected. Therefore, the band of laser light can be stably narrowed. In addition, in the external resonator-type semiconductor laser device, the disposition position of the VBG can be displaced with respect to the input and output end surface of the optical fiber by the displacement unit. Accordingly, the degree of return of the return light from the VBG can be changed at the input and output end surface of the optical fiber, so that the light quantity of the return light which is optically coupled to the input and output end surface can be adjusted. Therefore, the output of the laser light can be easily adjusted.

In the external resonator-type semiconductor laser device, the displacement unit may displace the VBG in a direction along an optical axis of the light. In this case, the degree of spread of the return light from the VBG can be changed at the input and output end surface of the optical fiber by the displacement of the VBG Therefore, the light quantity of the return light that is optically coupled to the input and output end surface can be easily adjusted.

In the external resonator-type semiconductor laser device, a condensing lens may be disposed between the input and output end surface of the optical fiber and the VBG In this case, the amount of a change in degree of spread of the return light from the VBG with respect to the amount of displacement of the VBG can be suppressed. Therefore, the light quantity of the return light that is optically coupled to the input and output end surface can be more finely adjusted.

In the external resonator-type semiconductor laser device, a collimating lens may be disposed between the input and output end surface of the optical fiber and the VBG, and the displacement unit may displace the VBG in a direction intersecting an optical axis of the output light. In this case, the light quantity of light reflected by the VBG can be changed by the displacement of the VBG Therefore, the light quantity of the return light that is optically coupled to the input and output end surface can be easily adjusted.

Advantageous Effects of Invention

According to the present disclosure, the band of the laser light can be stably narrowed, and output adjustment can be easily performed.

DESCRIPTION OF EMBODIMENTS

Hereinafter, preferred embodiments of an external resonator-type semiconductor laser device according to one aspect of the present disclosure will be described in detail with reference to the drawings.

First Embodiment

Figure 1:
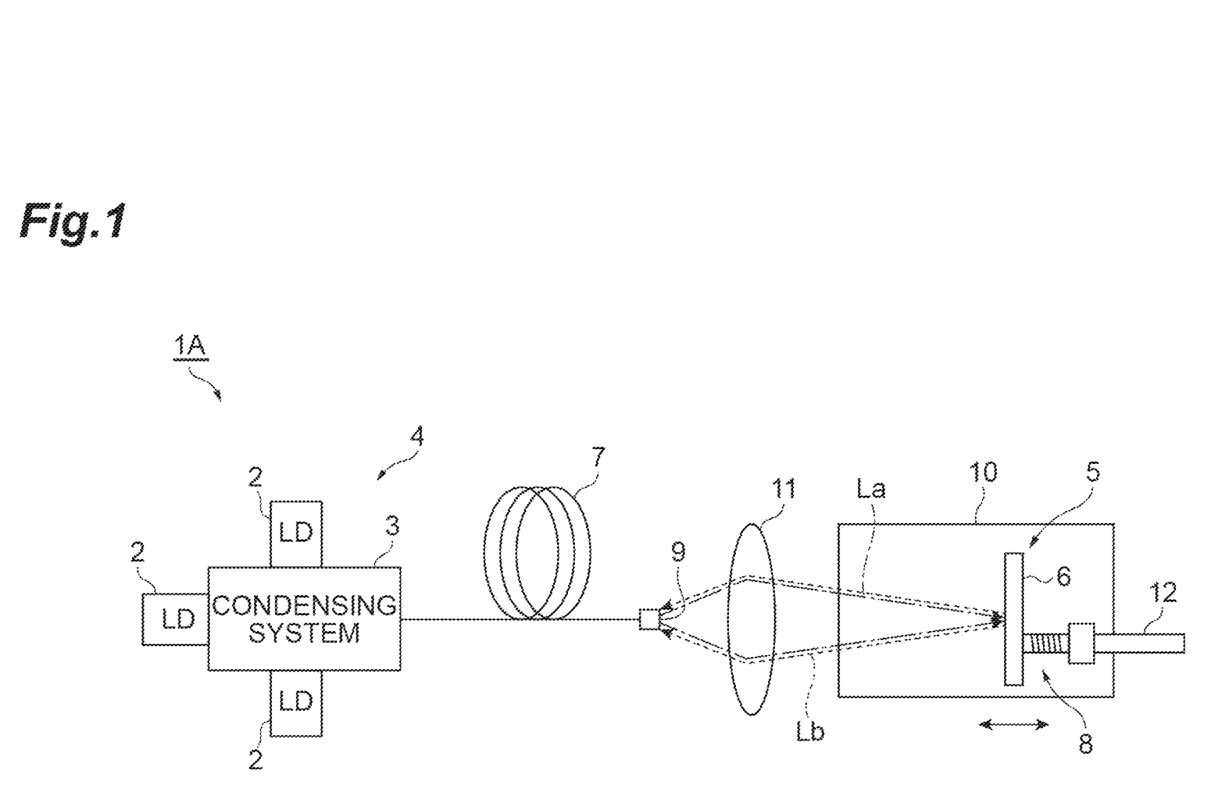
FIG. 1 is a schematic view illustrating a configuration of an external resonator-type semiconductor laser device according to a first embodiment.

FIG. 1 is a schematic view illustrating a configuration of an external resonator-type semiconductor laser device according to a first embodiment. As illustrated in the same drawing, an external resonator-type semiconductor laser device 1A according to the first embodiment includes a light source unit 4 in which one or a plurality of laser diode light sources 2 are optically coupled by a condensing system 3; a volume bragg grating (VBG) 6 that forms an external resonator 5, together with the laser diode light sources 2; an optical fiber 7 that guides light between the light source unit 4 and the VBG 6; and a displacement unit 8 that displaces the disposition position of the VBG 6.

In the present embodiment, the plurality of laser diode light sources 2 form the light source unit 4. In addition, the condensing system 3 is formed of, for example, an optical fiber coupler or the like. The optical fiber 7 is formed of, for example, a multimode fiber having a core of 100 μm. An end portion on a light source unit 4 side of the optical fiber 7 is optically coupled to the condensing system. An end portion on a VBG 6 side of the optical fiber 7 is an input and output end surface 9 which outputs light from the light source unit 4 (hereinafter, referred to as "output light La") and into which light from the VBG 6 (hereinafter, referred to as "return light Lb") is input. The input and output end surface 9 may be provided with a connector or a ferrule as needed. When the connector is used, it is preferable that a coaxial connector such as a SMA connector is used.

The VBG 6 is an optical element that Bragg reflects input light to exhibit narrow wavelength selectivity and narrow angle selectivity. Here, a reflective VBG having a reflectance of 90% or more to the output light La is used. The VBG 6 has, for example, a plate shape having a side of 1 mm and a thickness of 2 mm. The VBG 6 is disposed on a mount 10 to be located on an optical axis of the output light La output from the input and output end surface 9 of the optical fiber 7. In the present embodiment, the optical axis of the output light La is orthogonal to the input and output end surface 9 of the optical fiber 7. In addition, in the present embodiment, a condensing lens 11 is disposed between the input and output end surface 9 of the optical fiber 7 and the VBG 6. The output light La output from the input and output end surface 9 of the optical fiber 7 is condensed by the condensing lens 11 to be incident on the VBG 6. A specific wavelength component of the output light La incident is Bragg reflected by the VBG 6 to become the return light Lb. The return light Lb is optically coupled to the input and output end surface 9 to be guided to the optical fiber 7 and then to return to an active layer of each of the laser diode light sources 2 via the condensing system 3.

The displacement unit 8 is a portion that displaces the disposition position of the VBG 6 with respect to the input and output end surface 9 of the optical fiber 7. In the present embodiment, the displacement unit 8 is formed of, for example, a microscrew 12 attached to the mount 10. The microscrew 12 is provided on a back side of the VBG 6 when viewed from an input and output end surface 9 side. The microscrew 12 is operated to displace the VBG 6 in a direction along the optical axis of the output light La. The displacement unit 8 is not limited to the microscrew 12, and can be also formed of, for example, other means such as a piezoelectric element, a pantograph, and a spring. The displacement unit 8 may be configured to use non-contact means such as electromagnetic force to displace the VBG 6 on a stage. The amount of movement of the VBG 6 caused by the displacement unit 8 depends on a selection of the condensing lens 11, and is approximately several millimeters. As one example, when the diameter of the condensing lens 11 is $10 mm and the focal distance is 7.5 mm, the amount of movement of the VBG 6 caused by the displacement unit 8 is approximately ±2 mm.

Figure 2:
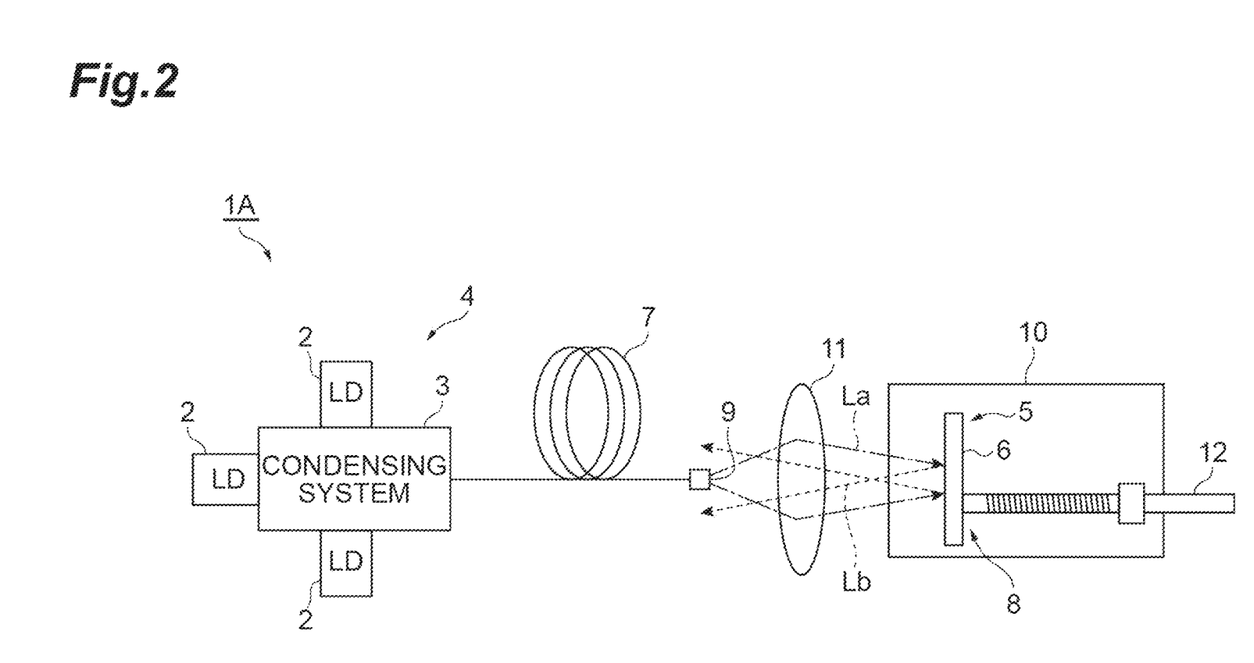
FIG. 2 is a schematic view illustrating a mode of output adjustment in the external resonator-type semiconductor laser device illustrated in FIG. 1.

When the VBG 6 is displaced away from a condensing position side of the output light La by the displacement unit 8, as illustrated in FIG. 1, the degree of spread of the return light Lb from the VBG 6 at the input and output end surface 9 can be decreased. On the other hand, when the VBG 6 is displaced close to the input and output end surface 9 side by the displacement unit 8, as illustrated in FIG. 2, the degree of spread of the return light Lb from the VBG 6 at the input and output end surface 9 can be increased. Accordingly, the light quantity of the return light Lb that is optically coupled to the input and output end surface 9 of the optical fiber 7 can be adjusted, so that the output of laser light (unillustrated) output from the external resonator-type semiconductor laser device 1A can be adjusted.

Figure 3:
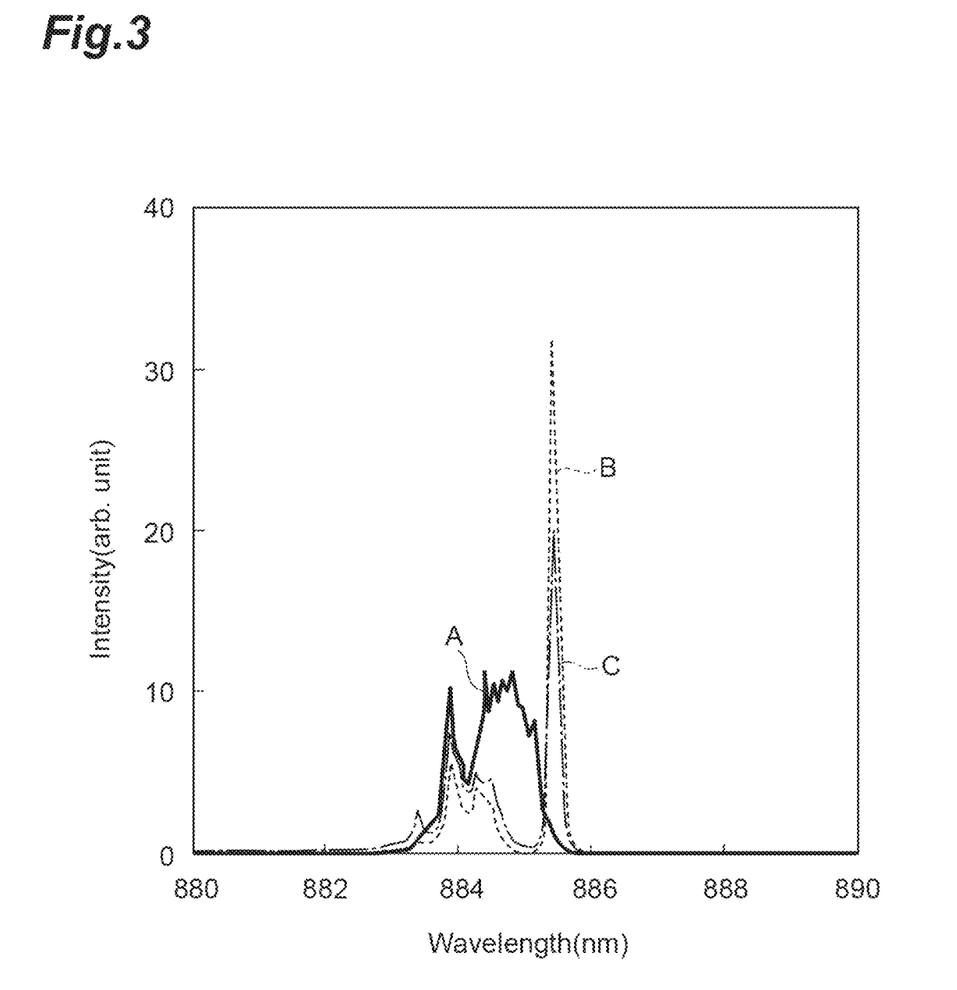
FIG. 3 is a graph showing results of an effect confirmation experiment of the present disclosure.

FIG. 3 is a graph showing results of an effect confirmation experiment of the present disclosure. In the effect confirmation experiment, when the external resonator was not formed (graph A), when the VBG was located at the condensing position of the condensing lens by the displacement unit (graph B), and when the VBG was located in the vicinity of the input and output end surface of the optical fiber by the displacement unit (graph C), spectral profiles of laser light output from the semiconductor laser device were measured. The value of a drive current applied to each of the laser diode light sources was 1.8 A. In FIG. 3, the horizontal axis is the wavelength and the vertical axis is the intensity (arbitrary unit).

From the results shown in FIG. 3, it can be seen that when the external resonator is formed of the VBG, a steeper peak having a narrow wavelength range is obtained as compared to when the external resonator is not formed. In addition, it can be seen that when the VBG is located at the condensing position of the condensing lens, and when the VBG is located in the vicinity of the input and output end surface of the optical fiber, only the intensity is changed while a peak waveform is maintained. Therefore, it can be concluded that the configuration where the disposition position of the VBG is displaced by the displacement unit contributes to realizing both of stably narrowing the band of and adjusting the output of the laser light.

As described above, in the external resonator-type semiconductor laser device 1A, the external resonator 5 is formed of the VBG 6, so that the wavelength of light resonating in the external resonator 5 can be selected. Therefore, the band of laser light can be stably narrowed. In addition, in the external resonator-type semiconductor laser device 1A, the disposition position of the VBG 6 can be displaced with respect to the input and output end surface 9 of the optical fiber 7 by the displacement unit 8. Accordingly, the degree of return of the return light Lb from the VBG 6 can be changed at the input and output end surface 9 of the optical fiber 7, so that the light quantity of the return light Lb which is optically coupled to the input and output end surface 9 can be adjusted. Therefore, the output of the laser light can be easily adjusted.

In the present embodiment, the displacement unit 8 displaces the VBG 6 in the direction along the optical axis of the light. In this case, the degree of spread of the return light Lb from the VBG 6 can be changed at the input and output end surface 9 of the optical fiber 7 by the displacement of the VBG 6. Therefore, the light quantity of the return light Lb that is optically coupled to the input and output end surface 9 can be easily adjusted, so that the output of the laser light can be easily adjusted.

In the present embodiment, the condensing lens 11 is disposed between the input and output end surface 9 of the optical fiber 7 and the VBG 6. In this case, the amount of a change in degree of spread of the return light Lb from the VBG 6 with respect to the amount of displacement of the VBG 6 can be suppressed. Therefore, the light quantity of the return light Lb that is optically coupled to the input and output end surface 9 can be more finely adjusted.

An advantage of the configuration where the external resonator 5 is formed of the VBG 6 is that the angle selectivity of the return light Lb can be further secured as compared to when an element such as a partial reflection mirror is used. When the VBG 6 is used, the output light La is Bragg reflected by the VBG 6. In reflection by a normal mirror, an incidence angle $\theta$ and a reflection angle $\alpha$ are equal. On the other hand, in reflection by the VBG 6, the reflection angle with respect to the incidence angle $\theta$ is $\alpha \pm 2\Delta\theta$, and an angle width of $2\Delta\theta$ can be obtained ($\Delta\theta = n\lambda \cos\theta_1/D \sin 2\theta$: in the equation, n is the refractive index of the VBG, $\lambda$ is the wavelength of the incident light, and D is the thickness of the VBG). Therefore, even when an angular deviation of $2\Delta\theta$ occurs in the VBG 6, the return light Lb having a specific wavelength component can be optically coupled to the input and output end surface 9 of the optical fiber 7.

Second Embodiment

Figure 4:
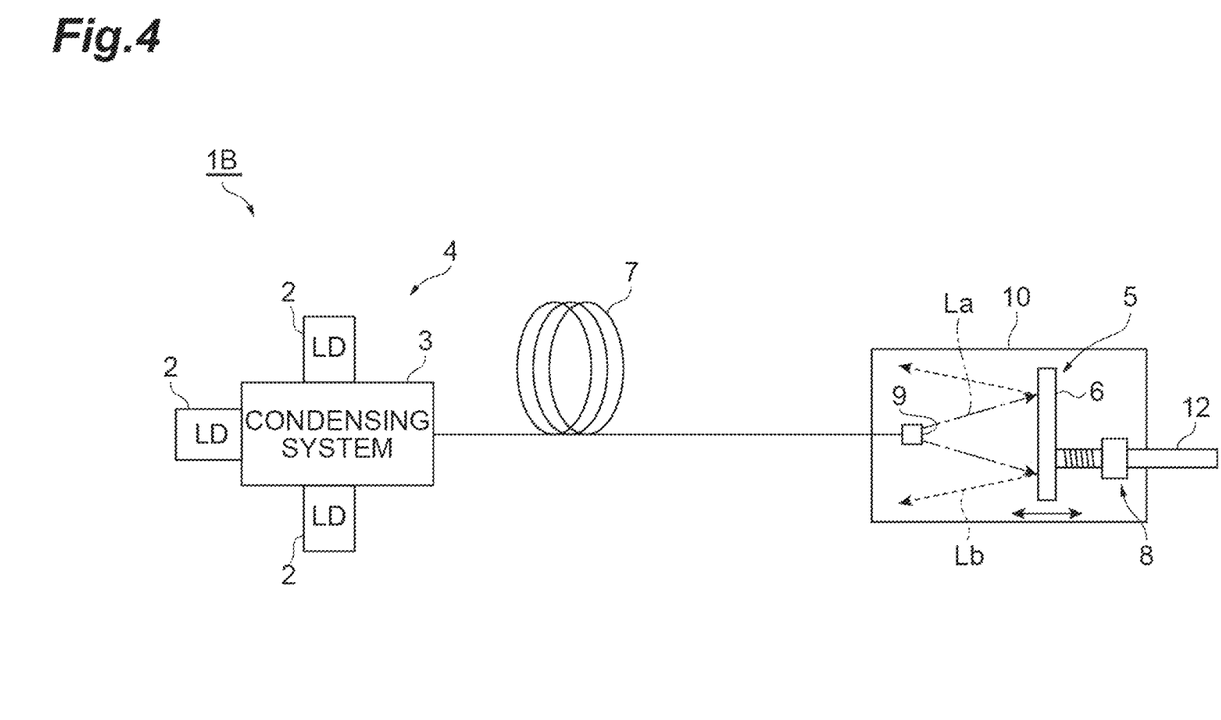
FIG. 4 is a schematic view illustrating a configuration of an external resonator-type semiconductor laser device according to a second embodiment.

FIG. 4 is a schematic view illustrating a configuration of an external resonator-type semiconductor laser device according to a second embodiment. As illustrated in the same drawing, an external resonator-type semiconductor laser device 1B according to the second embodiment differs from that of the first embodiment in that the condensing lens 11 is not disposed between the input and output end surface 9 of the optical fiber 7 and the VBG 6. Similar to the first embodiment, the VBG 6 has, for example, a plate shape having a side of 1 mm and a thickness of 2 mm.

Also in the second embodiment, the external resonator 5 is formed of the VBG 6, so that the wavelength of light resonating in the external resonator 5 can be selected. Therefore, the band of laser light can be stably narrowed. In addition, also in the second embodiment, the disposition position of the VBG 6 can be displaced with respect to the input and output end surface 9 of the optical fiber 7 by the displacement unit 8. Accordingly, the degree of return of the return light Lb from the VBG 6 can be changed at the input and output end surface 9 of the optical fiber 7, so that the light quantity of the return light Lb which is optically coupled to the input and output end surface 9 can be adjusted. Therefore, the output of the laser light can be easily adjusted.

In the second embodiment, the condensing lens 11 is not disposed between the input and output end surface 9 of the optical fiber 7 and the VBG 6. For this reason, the amount of a change in degree of spread of the return light Lb from the VBG 6 with respect to the amount of displacement of the VBG 6 can be further increased as compared to the first embodiment. Therefore, when the disposition position of the VBG 6 is slightly displaced, the light quantity of the return light Lb that is optically coupled to the input and output end surface 9 can be greatly adjusted.

Third Embodiment

Figure 5:
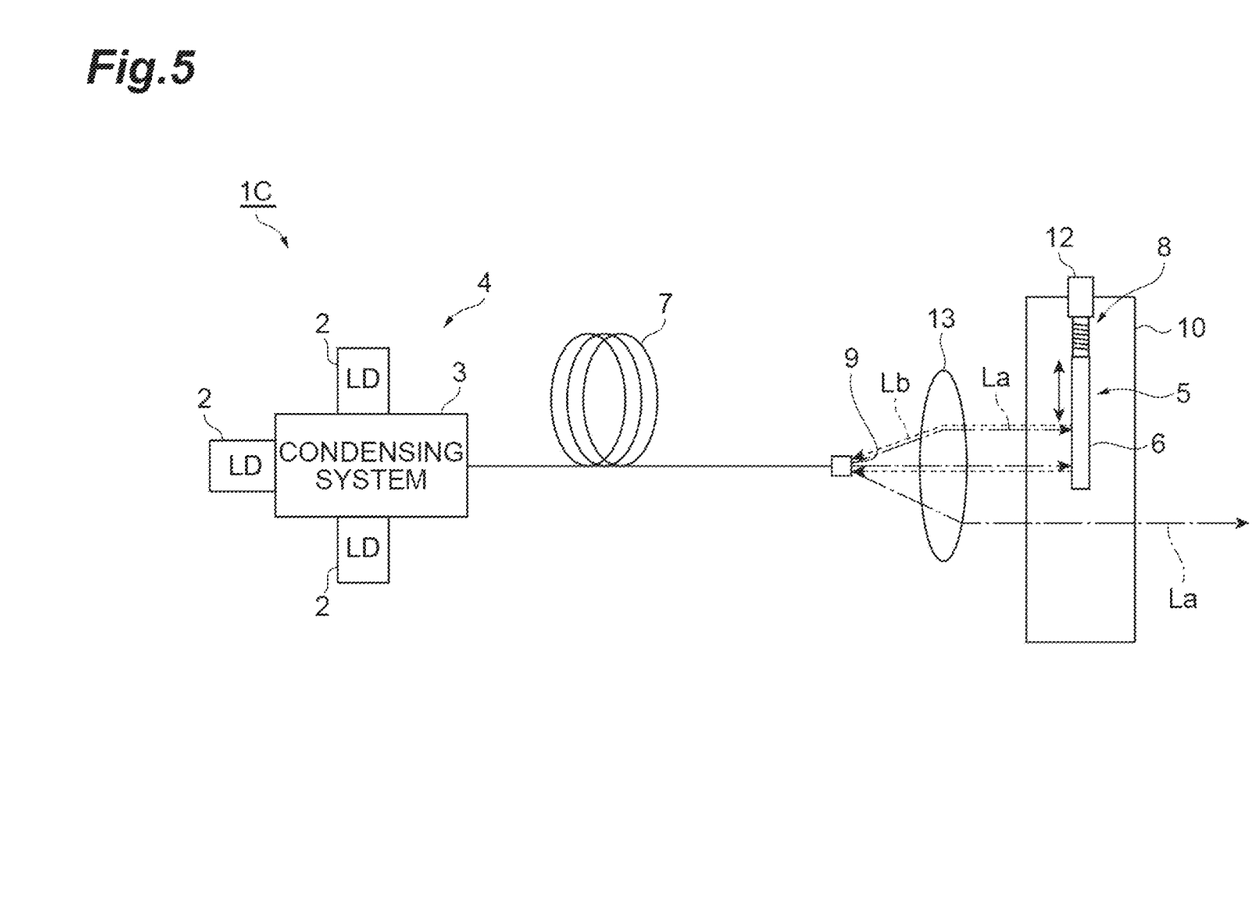
FIG. 5 is a schematic view illustrating a configuration of an external resonator-type semiconductor laser device according to a third embodiment.

FIG. 5 is a schematic view illustrating a configuration of an external resonator-type semiconductor laser device according to a third embodiment. As illustrated in the same drawing, an external resonator-type semiconductor laser device 1C according to the third embodiment differs from that of the first embodiment in the direction of displacement of the VBG 6 caused by the displacement unit 8.

More specifically, in the present embodiment, instead of the condensing lens 11, a collimating lens 13 is disposed between the input and output end surface 9 of the optical fiber 7 and the VBG 6. The collimating lens 13 is an element that parallelizes the output light La output from the input and output end surface 9. In the present embodiment, the VBG 6 has, for example, a plate shape having a side of 1 cm and a thickness of 2 mm. The VBG 6 is disposed on the mount 10 to straddle beam edges of the output light La parallelized by the collimating lens 13. A specific wavelength component of a part of the output light La parallelized is Bragg reflected by the VBG 6 to become the return light Lb. The rest of the output light La is not incident on the VBG 6 and is blocked by, for example, an absorbing member, a shielding member, or the like (unillustrated) not to return to the input and output end surface 9.

In the present embodiment, the microscrew 12 forming the displacement unit 8 is provided on a side surface side of the VBG 6. The microscrew 12 is operated to displace the VBG 6 in a direction intersecting (here, orthogonal to) the optical axis of the output light La. When the VBG 6 is displaced in a direction to advance toward an output light La side by the displacement unit 8, the range of the output light La reflected by the VBG 6 is widened, so that the light quantity of the return light Lb which is optically coupled to the input and output end surface 9 can be increased. On the other hand, when the VBG 6 is displaced in a direction to retract from the output light La side by the displacement unit 8, the range of the output light La reflected by the VBG 6 is narrowed, so that the light quantity of the return light Lb which is optically coupled to the input and output end surface 9 can be decreased.

Also in the third embodiment, the external resonator 5 is formed of the VBG 6, so that the wavelength of light resonating in the external resonator 5 can be selected. Therefore, the band of laser light can be stably narrowed. In addition, also in the third embodiment, the disposition position of the VBG 6 can be displaced with respect to the input and output end surface 9 of the optical fiber 7 by the displacement unit 8. Accordingly, the degree of return of the return light Lb from the VBG 6 can be changed at the input and output end surface 9 of the optical fiber 7, so that the light quantity of the return light Lb which is optically coupled to the input and output end surface 9 can be adjusted. Therefore, the output of the laser light can be easily adjusted.

REFERENCE SIGNS LIST 1A to 1C: external resonator-type semiconductor laser device, 2: laser diode light source, 6: VBG, 7: optical fiber, 8: displacement unit, 9: input and output end surface, 11: condensing lens, 13: collimating lens, La: output light, Lb: return light.

The invention claimed is:

1. An external resonator-type semiconductor laser device comprising:
   an external resonator formed of one or a plurality of laser diode light sources and a VBG;
   an optical fiber configured to output an output light from the laser diode light source toward the VBG, and to input a return light from the VBG; and
   a displacement unit configured to displace a disposition position of the VBG with respect to an input and output end surface of the output light and the return light in the optical fiber.

2. The external resonator-type semiconductor laser device according to claim 1,
   wherein the displacement unit displaces the VBG in a direction along an optical axis of the output light.

3. The external resonator-type semiconductor laser device according to claim 2,
   wherein a condensing lens is disposed between the input and output end surface of the optical fiber and the VBG.

4. The external resonator-type semiconductor laser device according to claim 1,
   wherein a collimating lens is disposed between the input and output end surface of the optical fiber and the VBG, and
   the displacement unit displaces the VBG in a direction intersecting an optical axis of the output light.

* * * * *